United States Patent [19]
Iyama et al.

[11] Patent Number: 5,986,935
[45] Date of Patent: Nov. 16, 1999

[54] SEMICONDUCTOR MEMORY DEVICE WITH HIGH VOLTAGE GENERATION CIRCUIT

[75] Inventors: Yumiko Iyama, Yokohama; Hironori Banba, Kamakura; Shigeru Atsumi, Yokohama, all of Japan

[73] Assignee: Kabushiki Kaisha Toshiba, Kawasaki, Japan

[21] Appl. No.: 09/031,350

[22] Filed: Feb. 27, 1998

[30] Foreign Application Priority Data

Jul. 28, 1997 [JP] Japan .................................. 9-201542

[51] Int. Cl.[6] .................................................. G11C 16/04
[52] U.S. Cl. ................................. 365/185.18; 365/185.26
[58] Field of Search .......................... 365/185.18, 185.23, 365/185.24, 185.26, 185.29, 185.33, 218, 226, 189.09; 327/535, 536, 537

[56] References Cited

U.S. PATENT DOCUMENTS

| | | | |
|---|---|---|---|
| 4,935,644 | 6/1990 | Tsujimoto | 327/536 |
| 5,430,402 | 7/1995 | Tedrow et al. | 365/226 |
| 5,524,266 | 6/1996 | Tedrow et al. | 365/185.18 |
| 5,589,793 | 12/1996 | Kassapian | 327/536 |
| 5,644,534 | 7/1997 | Soejima | 365/189.09 |
| 5,734,286 | 3/1998 | Takeyama et al. | 327/536 |
| 5,734,290 | 3/1998 | Chang et al. | 327/536 |
| 5,812,018 | 9/1998 | Sudo et al. | 327/536 |
| 5,818,289 | 10/1998 | Chevallier et al. | 327/536 |
| 5,821,805 | 10/1998 | Jinbo | 327/536 |

Primary Examiner—Trong Phan
Attorney, Agent, or Firm—Banner & Witcoff, Ltd.

[57] ABSTRACT

A semiconductor memory device is provided which incorporates a voltage generation circuit capable of generating a high voltage even when a low power voltage is applied to the device. To control the gate voltage of each cell included in a memory cell array, a negative voltage generating circuit connected to a row decoder is included in a boosting circuit. In the case of using a single power of a low voltage, the negative voltage generating circuit generates a negative high voltage during, for example, data erasing. The gate of each P-channel MOS transistor for data transfer is supplied with a pulse signal with an amplitude based on a voltage VCCH which is higher than an external power voltage VCC and obtained by boosting the voltage VCC. As a result, a high voltage can be transferred and output efficiently even if the external power voltage is low.

9 Claims, 8 Drawing Sheets

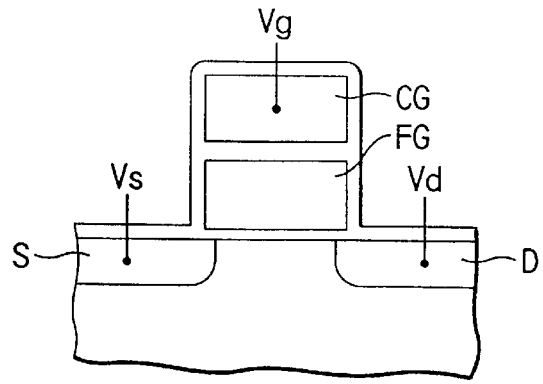
FIG. 1
PRIOR ART
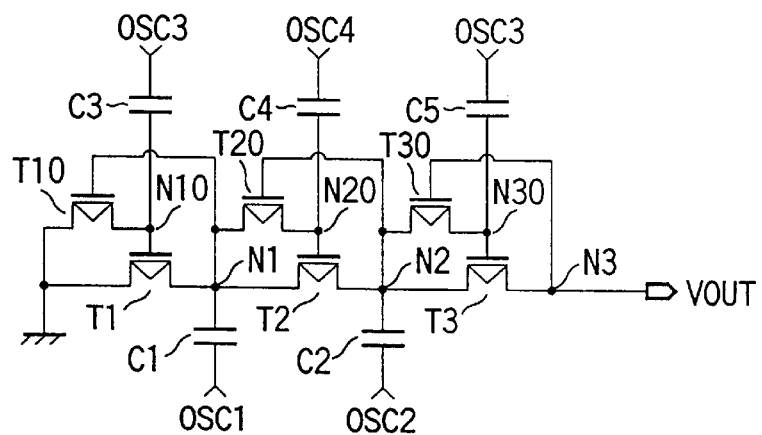
FIG. 2
PRIOR ART
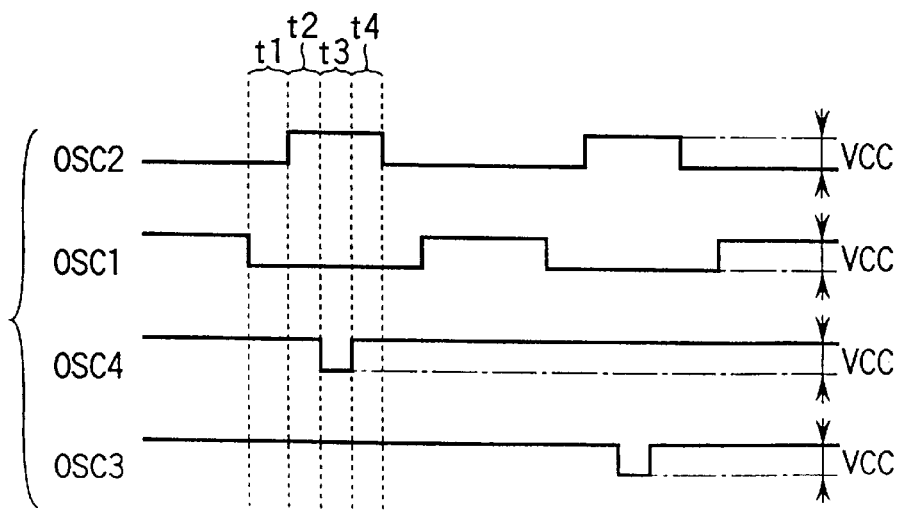
FIG. 3
PRIOR ART
FIG. 4
PRIOR ART Vbg: BACK GATE VOLTAGE
(N-well SUBSTRATE POTENTIAL)

SEMICONDUCTOR MEMORY DEVICE WITH HIGH VOLTAGE GENERATION CIRCUIT

BACKGROUND OF THE INVENTION

This invention relates to a semiconductor memory device with a circuit which is supplied with, in particular, a low power voltage from the outside and generates a high negative or positive voltage.

FIG. 1 is a view, showing a general flash memory cell. The flash memory uses, as a memory cell, a stacked-gate transistor which has a floating gate FG and a control CG.

This memory cell performs data programming and erasing when electrons are injected into the floating gate FG and discharged therefrom to vary the threshold voltage of the memory cell. Therefore, it is necessary to set various potential relationships between the voltage Vg of the gate (control gate CG) of the memory cell, the voltage Vd of the drain (D) thereof, and the voltage Vs of the source (S) thereof. FIG. 2 shows examples of voltages applied to each element of the memory cell at the time of data reading, programming and erasing.

The external power of a flash memory which performs hot electron writing is provided in the form of a combination of two powers of VCC=5 V and VPP=12 V, a single power of VCC=5 V, or a single power of VCC=3 V. The external power is converted, before being to the memory cell, to a voltage suitable for the cell by a boosting circuit and a negative voltage generating circuit incorporated in the memory device.

For example, in the case of the single power of VCC=5 V, a gate voltage Vg of 10 V or more is generated by the boosting circuit at the time of programming, while a gate voltage Vg of −10 V is generated by the negative voltage generating circuit at the time of erasing, as is shown in FIG. 2. In the case of the single power of VCC=3 V, it is necessary to generate, using the booster circuit, a gate voltage Vg of 10 V or more and a drain voltage of Vd of 5 V at the time of programming and a source voltage Vs of 5 V at the time of erasing. On the other hand, it is necessary to generate a gate voltage Vg of −10 V at the time of erasing, using the negative voltage generating circuit.

FIG. 3 is a circuit diagram, showing the structure of the negative voltage generating circuit. This structure is applied to a flash memory with the single power of VCC=5 V. As is shown in FIG. 3, the current paths of P-channel MOS transistors T1, T2 and T3 for signal transfer are connected in series between the ground terminal and an output terminal VOUT. Capacitors C1 and C2 are connected to nodes N1 and N2 between the transistors T1 and T2, and T2 and—T3, respectively. The other electrodes of the capacitors C1 and C2 are disposed to receive pulse signals OSC1 and OSC2, respectively. The gates of the transistors T1–T3 are connected to capacitors C3–C5, respectively. The other electrodes of the capacitors C3–C5 are disposed to receive pulse signals OSC3, OSC4 and OSC3, respectively.

Each of P-channel MOS transistors T10, T20 and T30 has its current path connected between the gate and drain of a corresponding one of the transistors T1, T2 and T3. The gates of the transistors T10, T20 and T30 are connected to the sources (nodes N1–N3) of the transistors T1–T3, respectively. In other words, the transistors T10, T20 and T30 are provided for compensating for the threshold voltages of the transistors T1–T3 which serve as diodes. The gates of the transistors T1–T3 are connected to nodes N10, N20 and N30, respectively.

The FIG. 3 circuit generates a negative voltage at the terminal VOUT when the pulse signals OSC1, OSC2, OSC3, OSC4 and OSC3 are input to the capacitors C1–C5, respectively. The pulse signals OSC1, OSC2, OSC3, OSC4 and OSC3 have waveforms as shown in FIG. 4 and are output from a pulse generating circuit which will be described below.

FIG. 5 is a circuit diagram, showing an example of a pulse generating circuit for generating the pulse signals shown in FIG. 4. This pulse generating circuit comprises a ring oscillator (A) for generating a signal of a voluntary cycle, and a pulse forming circuit (B) for converting the output of the oscillator to a voluntary waveform.

The ring oscillator (A) is constituted by a number (2 n+1) of inverters arranged in series (the FIG. 5 case includes a NAND gate 11 and inverters 12–19, i.e. nine inverters). Signals RO1, RO2, RO3 and RO4 are output from the junctions between the inverters 12 and 13, between the inverters 14 and 15, between the inverters 16 and 17 and between the inverters 18 and 19, respectively.

One input OSCE of the NAND gate 11 is set at "H" (high level) to operate the ring oscillator (A), and at "L" (low level) to stop it. Each of the outputs RO1–RO4 is supplied to a corresponding one of the input terminals of the pulse forming circuit (B).

The pulse forming circuit (B) includes a series circuit of a NOR gate 211 and inverters 221 and 231, a series circuit of a NOR gate 212 and inverters 222 and 232, a series circuit of a NAND gate 213 and inverters 223 and 233, and a series circuit of a NAND gate 214 and inverters 224 and 234. The NOR gate 211 receives the outputs RO2 and RO3 of the ring oscillator (A), and the inverter 231 outputs the pulse signal OSC1. The NOR gate 212 receives the inverted signal of the output RO2 (a signal via the inverter 241) of the ring oscillator (A) and the inverted signal of the output RO3 (a signal via the inverter 242) of the same, and the inverter 232 outputs the pulse signal OSC2. The NAND gate 213 receives the inverted signal of the output RO1 (a signal via the inverter 243) and the inverted signal of the output RO4 (a signal via the inverter 244), and the inverter 233 outputs the pulse signal OSC3. The NAND gate 214 receives the outputs RO1 and RO4 of the ring oscillator (A), and the inverter 234 outputs the pulse signal OSC4.

The output pulse signals OSC1–OSC4 of the pulse generating circuit of FIG. 5 have waveforms as shown in FIG. 4. P-channel MOS transistors and N-channel MOS transistors incorporated in CMOS inverters which constitute the last-stage inverters 231–234 in the pulse forming circuit (B) are connected to a power voltage terminal VCC and a ground terminal GND, respectively. Accordingly, the pulse amplitude (Vosc) of the pulse signals OSC1–OSC4 is VCC.

Referring to FIG. 4, the operation of the negative voltage generating circuit with the circuit structure shown in FIG. 3 will be described. Specifically, how the level of the node N2 decreases will be explained with reference to t1–t4 modes in FIG. 4.

t1: The level of the pulse signal OSC1 falls. Accordingly, the level of the node N1 falls as a result of coupling with the capacitor C1. Further, the transistor T20 is turned on, thereby setting the nodes N1 and N20 at the same level.

t2: The level of the pulse signal OSC2 rises. Accordingly, the level of the node N2 rises as a result of coupling with the capacitor C2 (N1<N2). Further, the transistor T20 is turned off, thereby shifting the node N20 into a floating state.

t3: The level of the pulse signal OSC4 falls. Accordingly, the level of the node N20 falls as a result of coupling with the capacitor C4. Further, the transistor T2 is turned on. In addition, since N1<N2 at t2, a current flows from the node N2 to the node N1, thereby the level of the node N2 falls.

t4: The level of the pulse signal OSC4 rises.

Accordingly, the level of the node N20 rises as a result of coupling with the capacitor C4. Further, the transistor T2 is turned off, thereby shifting the node N2 into a floating state.

As described above, the level of the node N2 falls since a current flows to the node N1 via the transfer transistor T2. At this time, the greater the current, the greater the level drop of the node N2.

This means that the greater the gate voltage of the transistor T2, the greater the convenience, when the transistor T2 is turned on. In the conventional case, the amplitude Vosc of the pulse signal OSC4 is identical to VCC as described above. Specifically, the pulse generating circuit shown in FIG. 3 is operated by a power voltage of 5 V and generates a pulse signal with an amplitude Vosc of 5 V.

To obtain a VOUT voltage of −10 V in the negative voltage generating circuit of FIG. 3, a bias of −10 V is locally applied to the substrate. For example, as is shown in FIG. 6, the P-channel MOS transistor T3 for signal transfer is formed in an N-well in a P-type substrate, and provides an output VOUT from its source. Accordingly, when the VOUT voltage is −10 V, the potential of the N-well cannot be set at less than GND to avoid a P-N forward voltage, since the substrate potential is GND. If the N-well potential is set at GND, a back gate bias of −10 V is applied to the transistor T3.

As a result, as shown in FIG. 7, the threshold voltage (Vth) of the transfer transistor T3 is Vthp, which is higher than 3 V, due to the back gate bias effect. To turn on the transistor T3, its gate/source voltage Vgs needs to be higher than Vthp. Since at this time, the pulse signal OSC3 is applied to the capacitor C5 in FIG. 3, |Vgs|≦Vosc is established. In the conventional case where Vsoc=VCC, the threshold voltage of the transfer transistor increases to a value higher than the power voltage VCC because of the substrate bias effect, if the power voltage is more and more reduced. As a result, it is possible that a negative voltage may not be transferred.

As described above, in the negative voltage generating circuit incorporated in the conventional semiconductor memory device, the lower the negative voltage to be obtained, the greater the back gate bias voltage and the greater the threshold voltage of the transfer transistor. Accordingly, the lower the operation power voltage VCC, the lower the gate/source voltage Vgs of the transfer transistor. In other words, the lower the VCC, the lower the absolute value of the negative voltage to be obtained, and the higher the lower limit of the negative voltage. This can be also said of a positive voltage generating circuit. In this case, it is possible that the upper limit of a positive voltage to be obtained from the circuit may be lowered.

BRIEF SUMMARY OF THE INVENTION

It is the object of the invention to provide a semiconductor memory device which incorporates a voltage generating circuit capable of generating a high-voltage output even if the power voltage VCC is low.

To attain the object, there is provided a semiconductor memory device comprising:

a memory cell including a charge accumulated area of a semiconductor substrate, and a control gate provided on the area, data programming and erasing in the memory cell being performed by transferring electric charge accumulated in the area; and a voltage generating circuit for generating one of control voltages to be applied to a predetermined node of the memory cell, wherein the voltage generating circuit comprises:

a first MOS transistor having a drain connected to a first node, a gate connected to a second node, and a source connected to a third node;

a first capacitive element having an electrode connected to the third node, and the other electrode disposed to receive a pulse signal with a first amplitude;

a second MOS transistor having a drain connected to the first node, a gate connected to the third node, and a source connected to the second node; and a second capacitive element having an electrode connected to the second node, and the other electrode disposed to receive a pulse signal with a second amplitude greater than the first amplitude.

In this invention, a high voltage is transferred efficiently by applying a pulse with a large amplitude to the gate of the first MOS transistor as a transfer transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a conceptual view, showing a general flash memory cell;

FIG. 2 is a view, showing examples of voltages to be applied to elements of the FIG. 1 cell at the time of data reading, programming and erasing therein;

FIG. 3 is a circuit diagram, showing a negative voltage generating circuit incorporated in the conventional semiconductor memory device;

FIG. 4 is a view, showing the waveforms of input pulse signals for controlling the operation of the FIG. 3 structure;

DETAILED DESCRIPTION OF THE INVENTION

Figure 8:
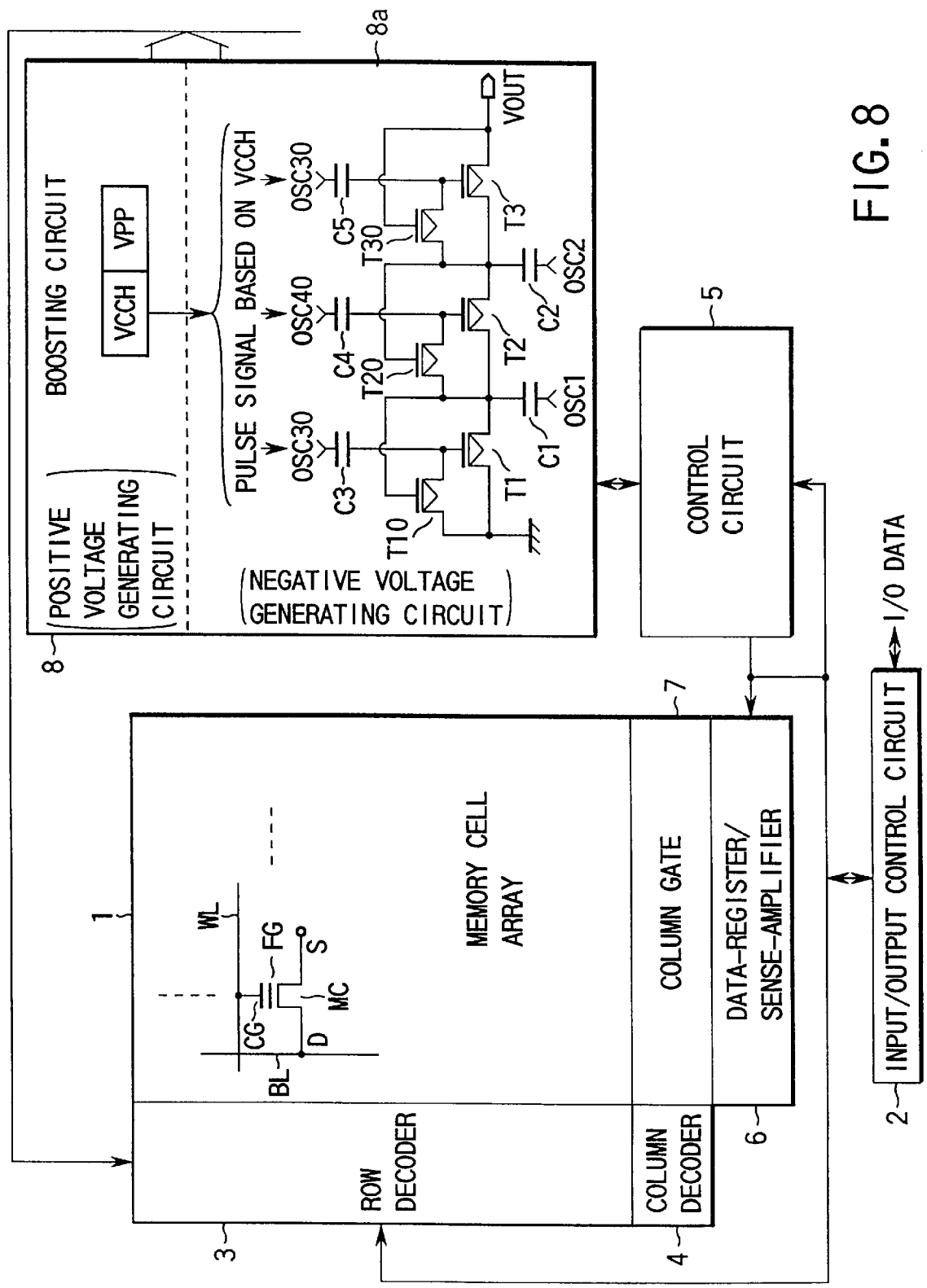
FIG. 8 is a block diagram, showing an essential part of a semiconductor memory device according to a first embodiment.

FIG. 8 is a block diagram, showing the structure of an essential part of a semiconductor memory device according to a first embodiment of the invention. The FIG. 8 memory device is a non-volatile semiconductor memory device which consists of, for example, a flash memory of a negative-voltage-gate erasing system.

A memory cell array 1 includes multiple non-volatile memory cells (MC) arranged in a matrix. Specifically, the memory cell array 1 is provided with a plurality of bit lines BL and word lines WL (only one bit line and one word line are shown), and a plurality of flash memory cells (only one cell is shown) MC which each have a floating gate FG as a charge accumulated portion, a control gate CG, a source S and a drain D. The flash memory cells perform electrical data programming and erasing when electrons are injected into or discharged from the floating gate FG of each cell, thereby varying the threshold value of the cell, which is determined when a predetermined potential is applied to the control gate CG. The control gate CG of each memory cell MC is connected to a corresponding one of the word lines WL. Further, the sources S of the memory cells MC included in, for example, each bit line, each word line or each block are connected to a common source line (not shown).

An input/output control circuit 2 generates an internal address signal in response to an address signal from the outside, and supplies the address signal to a row decoder 3, a column decoder 4 and a control circuit 5. Further, the circuit 2 supplies a data-register/sense-amplifier 6 with data fed from the outside during data programming, and outputs, to the outside, data sensed by the data-register/sense-amplifier 6 during data reading. A control circuit 5 is responsive to the internal address signal from the input/output control circuit 2 for controlling nodes to have predetermined potential relationships, depending upon whether programming, erasing or reading is performed.

The row decoder 3 selects one of the word lines WL in the memory cell array 1 on the basis of the internal address signal (internal row address signal). A column gate 7 selects one of the bit lines BL in the memory cell array 1 on the basis of the output of the column decoder 4. The data-register/sense-amplifier 6 senses, during programming, to-be-read data stored in the selected memory cell of the memory cell array 1.

A negative voltage generating circuit as booster means for generating a negative voltage is provided in a booster circuit 8. In the case of, for example, a single power of VCC=3 V, it is necessary to cause various positive voltage generating circuits included in the booster circuit 8 to generate a gate voltage Vg of 10 V or more and a drain voltage Vd of 5 V or more which are used during programming, and a source voltage Vs of 5 V which is used during erasing. It is also necessary to cause a negative voltage generating circuit (8a) included in the booster circuit 8 to generate a gate voltage Vg of −10V which is used during erasing.

The output system of the negative voltage generating circuit 8a has the same structure as that shown in FIG. 3 (main elements are denoted by corresponding reference numerals). In this invention, the gates of the P-channel MOS transistors T1–T3 for signal transfer are supplied with a voltage with, for example, a greater amplitude than the external power voltage, i.e. a pulse signal with an amplitude corresponding to a voltage VCCH which is obtained by boosting the external power VCC. This structure enables efficient transfer of a high voltage even when the external power voltage is low.

As is shown in FIG. 8, the negative voltage generating circuit 8a is constructed such that the transfer P-channel MOS transistors T1–T3 have their current paths connected in series between the ground terminal and the output terminal. Capacitors C1 and C2 are connected to the nodes between the transistors T1 and T2, and T2 and—T3, respectively. The other electrodes of the capacitors C1 and C2 are disposed to receive pulse signals OSC1 and OSC2, respectively, which have a first amplitude based on the external power voltage. The gates of the transistors T1–T3 are connected to capacitors C3–C5, respectively. The other electrodes of the capacitors C3–C5 are disposed to receive pulse signals OSC30, OSC40 and OSC30, respectively, which have a second amplitude based on the voltage VCCH higher than the external power voltage.

Each of P-channel MOS transistors T10, T20 and T30 has its current path connected between the gate and drain of a corresponding one of the transistors T1, T2 and T3. The gates of the transistors T10, T20 and T30 are connected to the sources of the transistors T1–T3, respectively. In other words, the transistors T10, T20 and T30 are provided for compensating for the threshold voltages of the transistors T1–T3 which serve as diodes.

Figure 9:
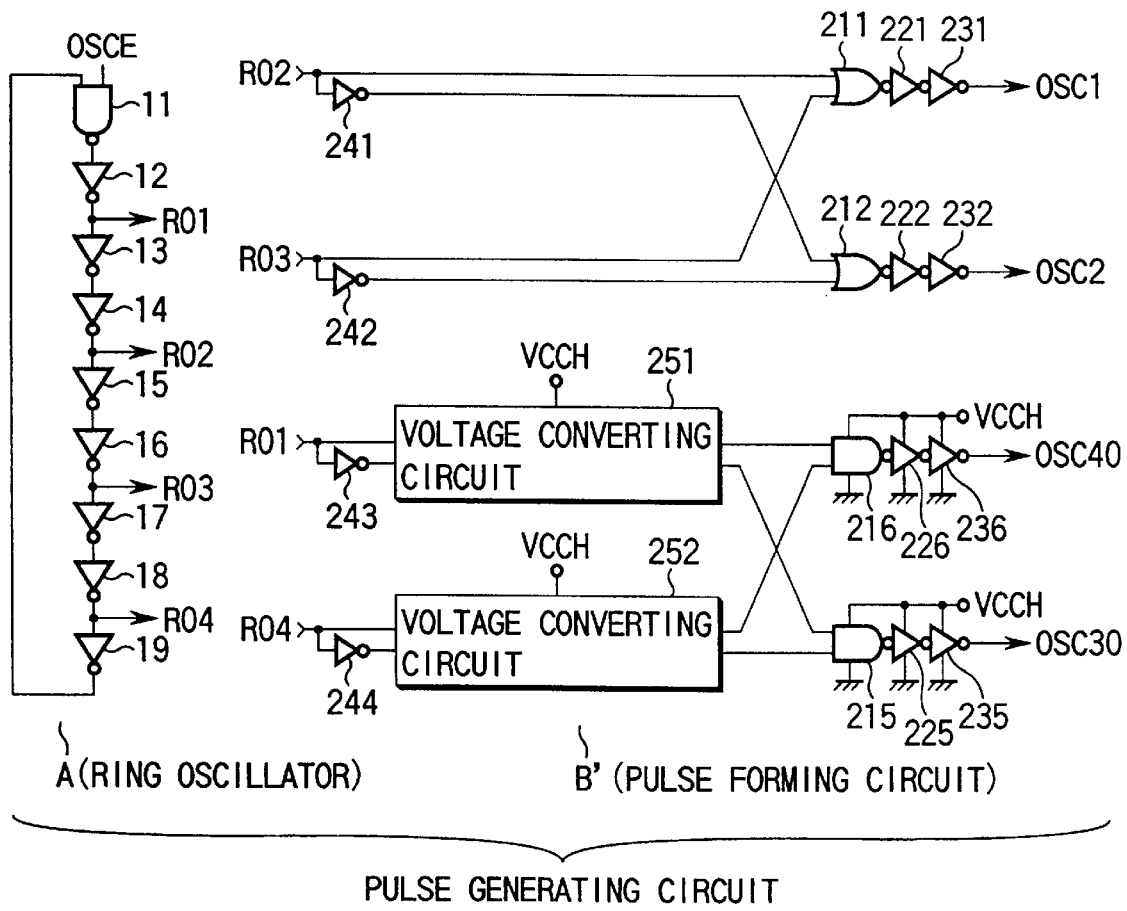
FIG. 9 is a circuit diagram, showing an example of a pulse generating circuit, according to a second embodiment, for generating pulse signals used to operate the negative voltage generating circuit of FIG. 8.
Figure 10:
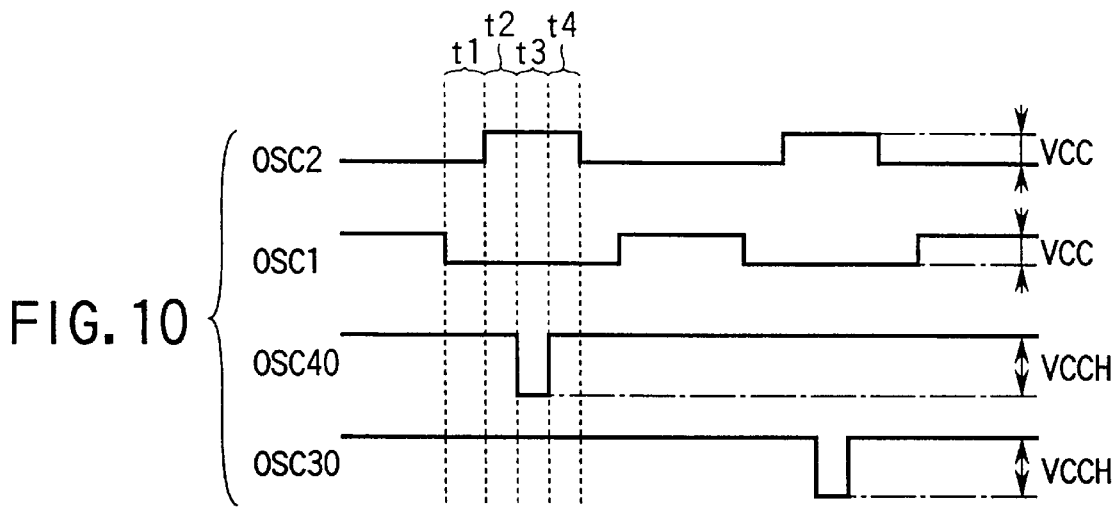
FIG. 10 is a view, showing the waveforms of the outputs of the pulse generating circuit shown in FIG. 9.

FIG. 9 is a circuit diagram, showing an example of a pulse generating circuit, according to a second embodiment, for generating pulse signals OSC1, OSC2, OSC30 and OSC40 to operate the negative voltage generating circuit 8a shown in FIG. 8. FIG. 10 is a view, showing the waveforms of the outputs of the pulse generating circuit.

Figure 5:
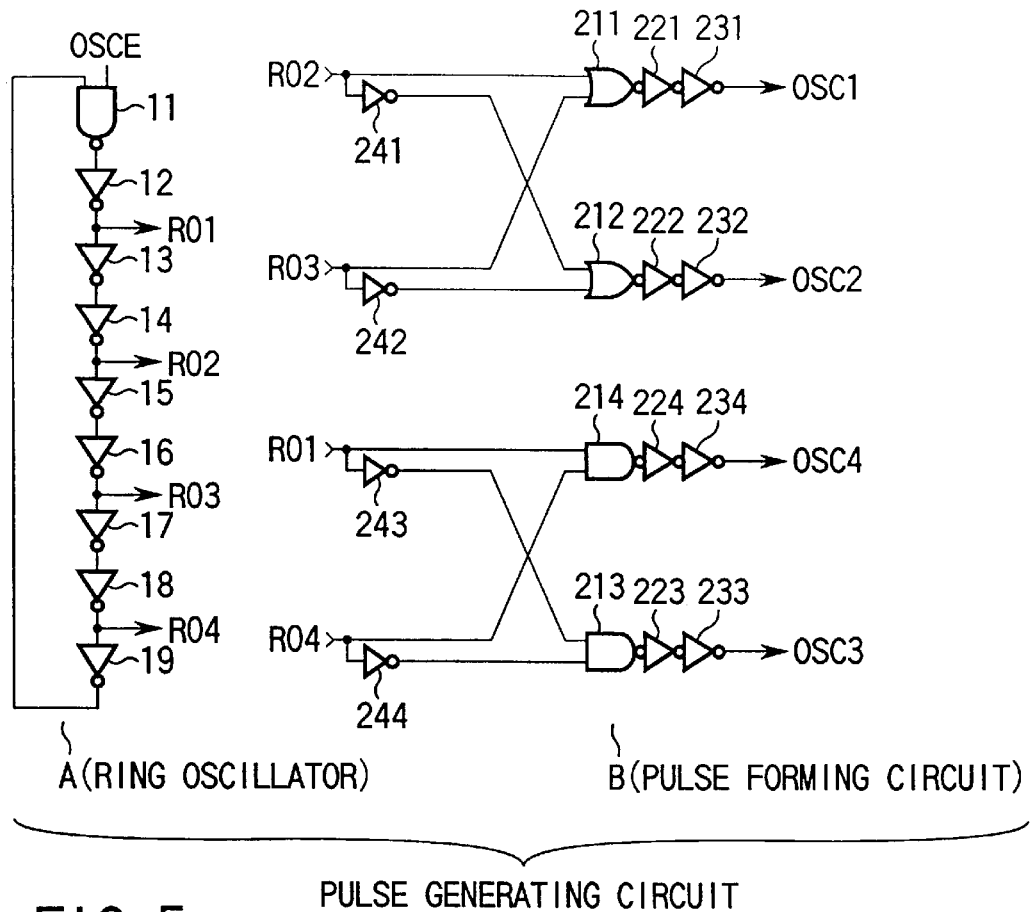
FIG. 5 is a view, showing an example of a pulse generating circuit for generating the pulse signals of FIG. 4.
Figure 6:
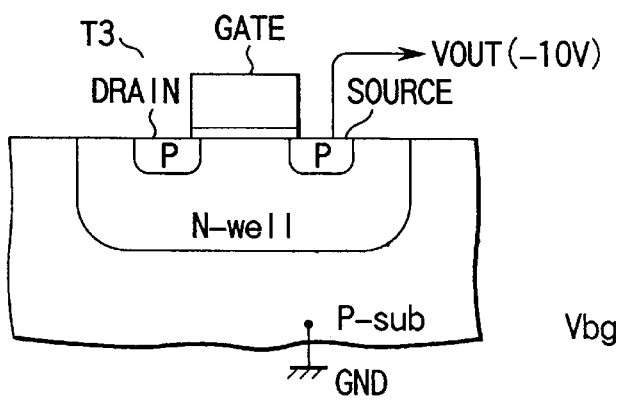
FIG. 6 is a conceptual view, showing a transistor incorporated in the FIG. 3 structure.
Figure 7:
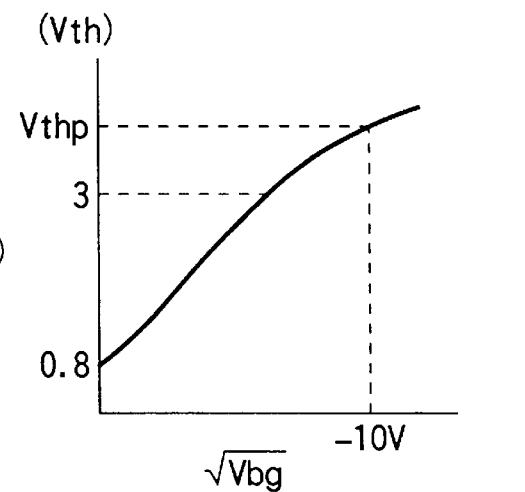
FIG. 7 is a graph, showing changes in the threshold voltage of the transistor of FIG. 6 due to a back gate bias effect.

The FIG. 9 structure has the same ring oscillator A as the FIG. 5 structure, and a pulse forming circuit B' for converting the output of the oscillator to a voluntary waveform, which circuit partially differs from that of the FIG. 5 structure. Specifically, the pulse forming circuit B' differs from the circuit B shown in FIG. 5 in that the former employs voltage converting circuits 251 and 252 for generating the pulse signals OSC30 and OSC40. A signal RO1 generated from the ring oscillator A and a signal obtained by converting the signal RO1 by the inverter 243, and a signal RO4 from the oscillator and a signal obtained by converting the signal RO4 by the inverter 244 are input respectively to the voltage converting circuits 251 and 252 supplied with the boosted voltage VCCH. A NAND gate 215, inverters 225 and 235, a NAND gate 216 and inverters 226 and 236, which are connected in series to each other, are supplied with the boosted voltage VCCH. In other words, each of P-channel MOS transistors (not shown), which constitute the NAND gate 215, the inverters 225 and 235, the NAND gate 216 and the inverters 226 and 236, is connected to the boosted power voltage terminal VCCH. Accordingly, a pulse amplitude Vosc=VCCH (e.g. a voltage obtained by boosting the external power voltage) can be obtained in place of a usual pulse amplitude Vosc=VCC (the external power voltage) (FIG. 10).

When the amplitude of each of the pulse signals OSC30 and OSC40 is set at VCCH, it is inconvenient if the power consumption increases. Since, however, the capacitors C3 and C4 are provided only for reducing the gate voltages of the transfer transistors T1–T3, they have a smaller capacitance than the capacitors C1 and C2. Therefore, an increase in power consumption as a result of setting the pulse signals OSC30 and OSC40 at VCCH can be minimized.

Figure 11:
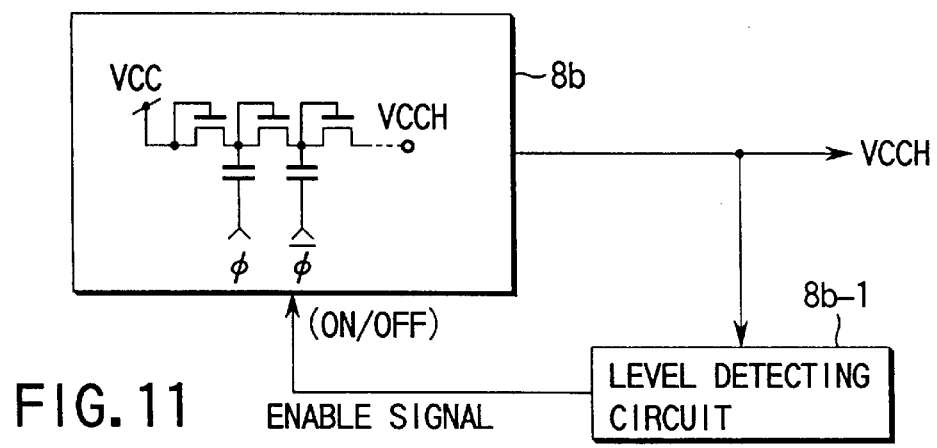
FIG. 11 is a block diagram, showing an example of a booster circuit for generating a boosted voltage used in FIG. 9.

FIG. 11 is a block diagram, showing the booster circuit (positive voltage generating circuit) for generating the boosted voltage VCCH. The power voltage VCC is boosted to the voltage VCCH higher than VCC by a charge pump incorporated in a circuit denoted by reference numeral 8b. A level detecting circuit 8b-1 performs feedback control of the operation of the charge pump to monitor the boosted voltage VCCH and stabilize it.

Figure 12:
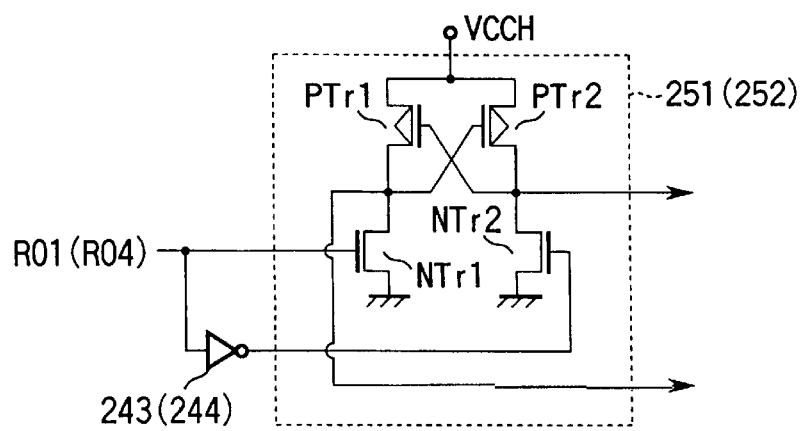
FIG. 12 a circuit, showing a specific example of a voltage converting circuit appearing in FIG. 9.

FIG. 12 is a circuit diagram, showing a specific structure of the voltage converting circuit 251 or 252 shown in FIG. 9. This circuit includes of a cross-coupling level shifter. Reference signs PTr1 and PTr2 denote P-channel MOS transistors, and reference signs NTr1 and NTr2 denote N-channel MOS transistors.

Suppose that a circuit as shown in the second embodiment is applied to the first embodiment. In the case of using a single power VCC of 3 V, the source voltage of each memory cell can be used. More specifically, during erasing, the source voltage Vs (=5 V) of each memory cell is generated by the boosting circuit 8, as well as the negative voltage (see FIG. 2). This boosted voltage of 5 V is used to set, at 5 V, the amplitude of a pulse applied to the gate of each transfer transistor T1, T2 or T3. Thus, the same gate/source voltage Vg as in the case of VCC=5 V can be applied to the transfer transistors. As a result, a high voltage can be efficiently transferred and output even if a low external power is supplied to the device.

Figure 13:
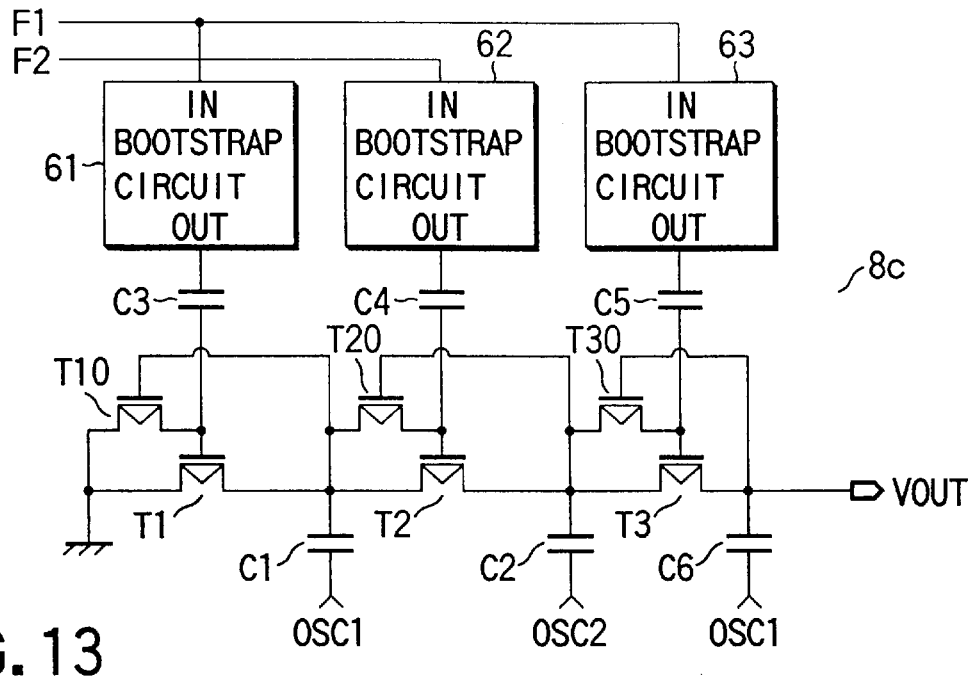
FIG. 13 is a circuit diagram, showing a negative voltage generating circuit according to a third embodiment.

FIG. 13 is a circuit diagram, showing a negative voltage generating circuit according to a third embodiment. Since the boosted voltage used in the second embodiment is obtained to supply each memory cell with a source voltage Vs used during erasing, it is necessary to supply a constant high voltage for a long period of time. To this end, the boosted voltage is generated by a charge pump similar to that incorporated in the negative voltage generating circuit (see FIG. 11). If, however, the boosted voltage is used only in the negative voltage generating circuit, it is not necessary to perform boosting for a long period of time. It suffices if the voltage is boosted only while the transfer transistor is turned on. This means that a voltage boosted by a bootstrap circuit can be used as the amplitude Vosc of a pulse signal.

As shown in FIG. 13, a negative voltage generating circuit 8c differs from the negative voltage generating circuit of FIG. 3, in that the former includes a bootstrap circuit 61 (62, 63) interposed between the other electrode of the capacitor C3 (C4, C5) and a pulse signal input terminal, and a capacitor C6 which has one electrode connected to the source of the transfer transistor T3 and the other electrode connected to a terminal through which the pulse signal OSC1 is supplied.

Figure 14A:
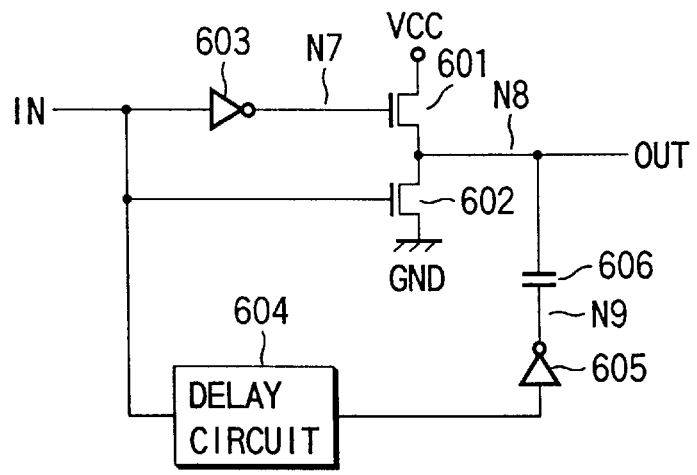
FIG. 14A is a circuit diagram, showing a specific example of a bootstrap circuit appearing in FIG. 13.

FIG. 14A is a circuit diagram, specifically showing one of the bootstrap circuits 61–63. As is shown in FIG. 14A, N-channel MOS transistors 601 and 602 are connected in series between the power voltage terminal VCC and the ground voltage terminal GND. The junction of the source and the drain of the transistors 601 and 602 is connected to an output terminal OUT. An input terminal IN is connected to the gate of the transistor 602, and also to the gate of the transistor 601 via an inverter 603. The input terminal IN is further connected to one electrode of a capacitor 606 via a delay circuit 604 and an inverter 605. The other electrode of the capacitor 606 is connected to an output terminal OUT.

Figure 14B:
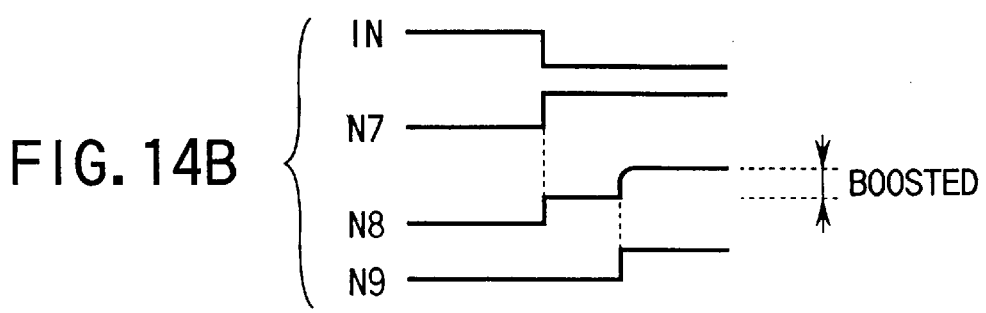
FIG. 14B is a view, showing the levels of elements incorporated in the FIG. 14A structure.

The operation of the bootstrap circuit shown in FIG. 14A will be described with reference to waveforms shown in FIG. 14B. In FIG. 14A, reference sign N7 denotes the gate of the transistor 601, reference sign N8 denotes a node connected to the output terminal OUT, and reference sign N9 denotes the output node of the inverter 605. When an input IN shifts from "H" to "L", the level of the node N7 is shifted from "L" to "H". As a result, the transistor 601 is turned on and the level of the node N8 becomes (VCC—Vthn) (where Vthn indicates the threshold voltage of the transistor 601). The node N9 is at "L" when the input IN has shifted, and changes to "H" after a predetermined delay required until the input IN has passed the delay circuit 604. At this time, the node N8 is at VCC+(VCC—Vthn) as a result of coupling with the capacitor 606.

Figure 16:
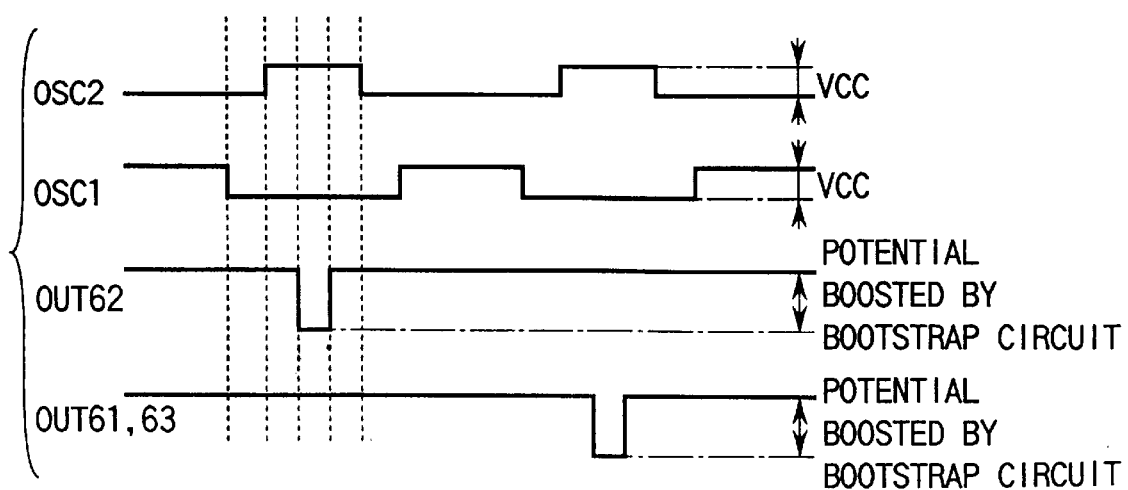
FIG. 16 is a view, showing the waveforms of elements incorporated in the negative voltage generating circuit of FIG. 13.

On the other hand, when the level of the input IN shifts from "L" to "H", the node N8 becomes "L" level and a bootstrap boosted voltage is obtained, as is shown in FIG. 16 which will be described later.

Signals F1 and F2 (FIG. 13) to be input to the bootstrap circuits 61–63 may be generated by dedicated circuits, or may be constituted of signals obtained by inverting the pulse signals OSC3 and OSC4 from the pulse generating circuit of FIG. 5.

Figure 15:
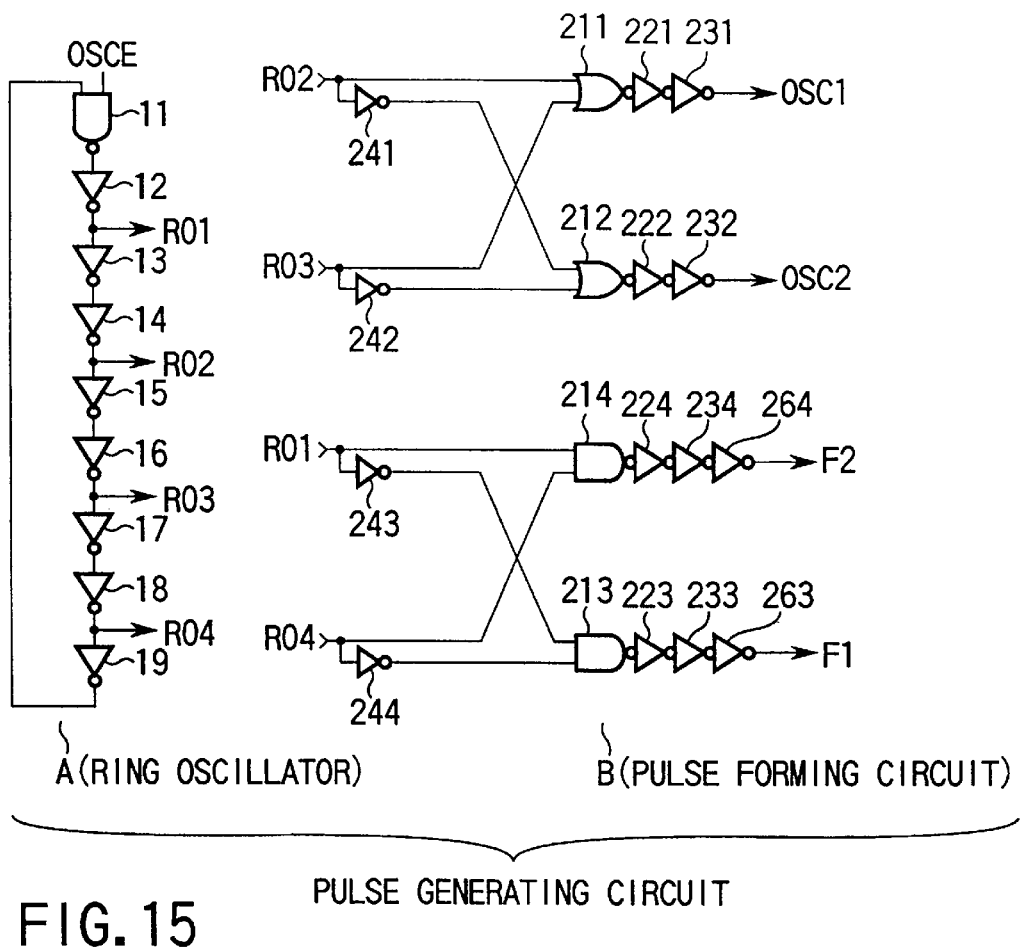
FIG. 15 is a circuit diagram, showing an example of a pulse generating circuit for generating pulse signals to be supplied to the FIG. 13 circuit.

The latter case will be described in more detail with reference to FIG. 15. FIG. 15 is a circuit diagram, showing an example of the pulse generating circuit which includes a function for generating the input signals F1 and F2. This structure differs from the FIG. 5 structure in that in the pulse forming circuit B of the former, an inverter 263 is connected to the output of the inverter 233, and an inverter 264 to the output of the inverter 234. Since the other elements are similar to those of the FIG. 5 structure, they are denoted by corresponding reference numerals, and no further explanation is given thereof. The output of the inverter 263 is the signal F1, while the output of the inverter 264 is the signal F2.

When these signals are input, the pulse signals OSC1 and OSC2 and the outputs from the output terminals OUT of the bootstrap circuits 61–63 have waveforms as shown in FIG. 16. This means that a pulse signal with an amplitude greater than the external power voltage (i.e. a pulse signal with an amplitude identical to the bootstrap boosted voltage), for example, is applied to the gate of each of the transfer P-channel MOS transistors T1–T3. Accordingly, a high voltage can be efficiently transferred and output even when a low external power is applied to the device, as in the first embodiment.

Figure 17:
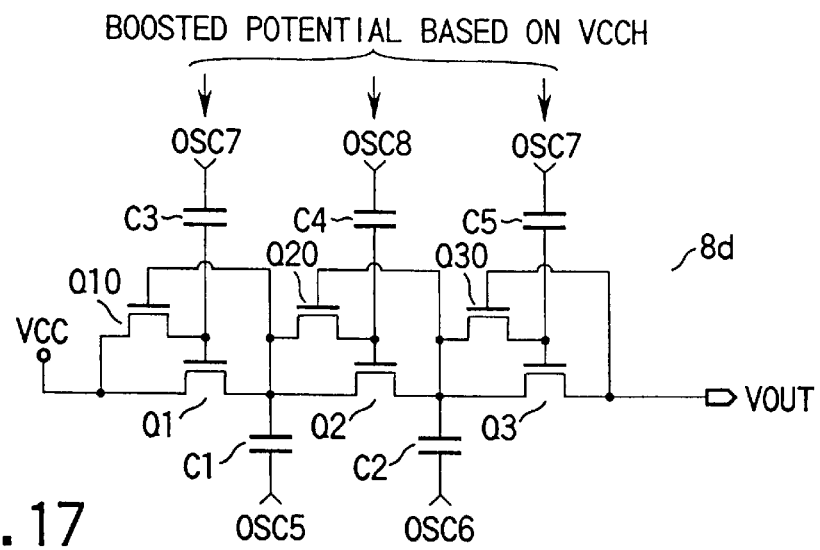
FIG. 17 is a circuit diagram, showing a positive voltage generating circuit according to a fourth embodiment of the invention.

FIG. 17 is a circuit diagram, showing a positive voltage generating circuit according to a fourth embodiment of the invention. This circuit is used as, for example, a positive voltage generating circuit incorporated in the boosting circuit 8 of FIG. 8. Where the external power VCC is further lowered, the positive voltage generating circuit generates a high voltage which is used as, for example, the gate voltage Vg during programming.

In a positive voltage generating circuit 8d shown in FIG. 17, the current paths of N-channel MOS transistors Q1, Q2 and Q3 for signal transfer are connected in series between a power voltage terminal VCC and an output terminal VOUT. Capacitors C1 and C2 are connected to nodes between the transistors Q1 and Q2, and Q2 and Q3, respectively. The other electrodes of the capacitors C1 and C2 are disposed to receive, for example, pulse signals OSC5 and OSC6, respectively, which have a first amplitude based on the external power. The gates of the transistors Q1–Q3 are connected to capacitors C3–C5, respectively. The other electrodes of the capacitors C3–C5 are disposed to receive, for example, pulse signals OSC7, OSC8 and OSC7, respectively, which have a second amplitude based on a voltage VCCH higher than the first amplitude or the external power.

Each of N-channel MOS transistors Q10, Q20 and Q30 has its current path connected between the gate and drain of a corresponding one of the transistors Q1, Q2 and Q3. The gates of the transistors Q10, Q20 and Q30 are connected to the sources of the transistors Q1–Q3, respectively. In other words, the transistors Q10, Q20 and Q30 are provided for compensating for the threshold voltages of the transistors Q1–Q3 which serve as diodes.

Figure 18:
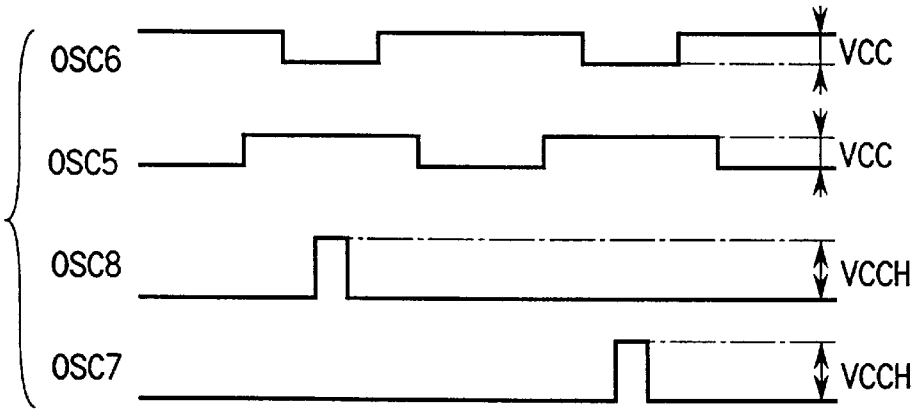
FIG. 18 is a view, showing the waveforms of pulse signals input to the FIG. 17 circuit.

FIG. 18 is a view, showing the waveforms of pulse signals input to the positive voltage generating circuit of FIG. 17. The pulse signals OSC5, OSC6, OSC7 and OSC8 have opposite phases to the pulse signals OSC1, OSC2, OSC30 and OSC40 shown in FIG. 10, which are used for operating the negative voltage generating circuit 8a of FIG. 8. Therefore, the pulse signals OSC5, OSC6, OSC7 and OSC8 can be obtained simply by modifying the ring oscillator A or the pulse forming circuit B' in FIG. 9 so that the outputs of the pulse generating circuit of FIG. 9 will be inverted. Since in this structure, pulse signals with the amplitude VCCH obtained by boosting the external power VCC are applied to the gates of the N-channel MOS transistors Q1–Q3, efficient transfer and output of a high voltage can be performed even when the external power is reduced.

The positive voltage generating circuit of FIG. 17 can be modified such that it employs the bootstrap circuits 61–63 shown in FIG. 13. In this case, it suffices if the ring oscillator A or the pulse forming circuit B are modified to invert the outputs of the pulse generating circuit of FIG. 15.

Figure 19:
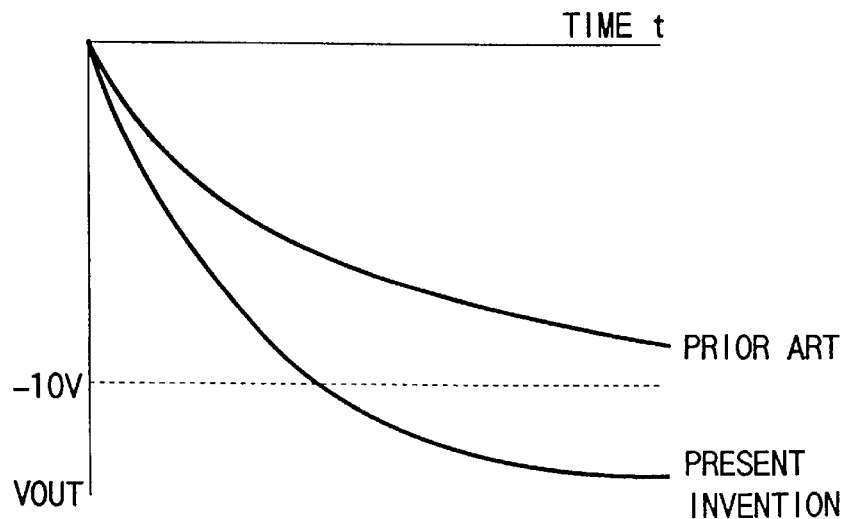
FIG. 19 is a graph, showing a difference, in time at which a negative voltage is generated, between the present invention and the conventional case.

According to the above-described embodiments, first, a negative voltage generating circuit can be constructed, which is for use in a flash memory device of a negative-voltage-gate erasing system and normally operable even when the power voltage is reduced. More specifically, in a structure wherein the output voltage is reduced using the pulse amplitude Vosc of a gate signal applied to a transfer transistor, the lower limit of a negative voltage to be generated can be widened as shown in FIG. 19, as compared with the conventional case, by incorporating, in the device, a circuit for increasing the pulse amplitude Vosc from the power voltage VCC to the higher voltage VCCH. Moreover, since the mutual conductance gm between transfer transistors is increased, the transfer efficiency is enhanced and hence the negative voltage can be generated more quickly. Second, a boosted output can be obtained more quickly and reliably by applying the above technique to a boosting circuit for a positive voltage generating circuit in order to deal with a further reduction in power voltage.

As described above, the invention can provide any memory device using a low power voltage with a semiconductor memory device capable of generating a required high voltage at high speed by inputting a pulse signal with an amplitude corresponding to a boosted voltage, to the gate of each transfer transistor incorporated in a negative or positive voltage generating circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

It is claimed:

1. A semiconductor memory device comprising:
    a memory cell formed on a semiconductor substrate, the memory cell including a charge accumulated portion and a control gate provided above the charge accumulated portion, wherein data programming and erasing in the memory cell is performed by transferring electric charge in the charge accumulated portion;
    a boosting circuit for boosting an external power supply voltage:
    a pulse generating circuit for generating first and second pulse signals with first and second amplitudes, respectively, the second amplitude being greater than the first amplitude, the pulse generating circuit including a voltage converting circuit which is supplied with a boosted voltage outputted from the boosting circuit, the voltage converting circuit generating the second pulse signal: and
    a voltage generating circuit for generating a control voltage to be applied to the memory cell, wherein the voltage generating circuit comprises:
      a first MOS transistor having a drain connected to a first node, a gate connected to a second node, and a source connected to a third node;
      a first capacitive element having a first electrode connected to the first node, and a second electrode disposed to receive the first pulse signal;
      a second MOS transistor having a drain connected to the first node, a gate connected to the third node, and a source connected to the second node; and
      a second capacitive element having a first electrode connected to the second node, and a second electrode disposed to receive the second pulse signal, wherein the first pulse signal is set at substantially the same level as the external power supply voltage, and the second pulse signal is set at substantially the same level as the boosted voltage outputted from the boosting circuit.

2. A semiconductor memory device comprising:
    a memory cell formed on a semiconductor substrate, the memory cell including a charge accumulated portion and a control gate provided above the charge accumulated portion, wherein data programming and erasing in the memory cell is performed by transferring electric charge in the charge accumulated portion;
    a boosting circuit for boosting an external power supply voltage;

a pulse generating circuit for generating first and second pulse signals with first and second amplitudes, respectively, the second amplitude being greater than the first amplitude, the pulse generating circuit including a voltage converting circuit which is supplied with a boosted voltage outputted from the boosting circuit, the voltage converting circuit generating the second pulse signal; and a negative voltage generating circuit for generating a control voltage to be applied to at least the control gate of the memory cell, wherein the negative voltage generating circuit comprises:
  a first P-channel MOS transistor having a drain connected to a first node, a gate connected to a second node, and a source connected to a third node;
  a first capacitive element having a first electrode connected to the first node, and a second electrode disposed to receive the first pulse signal;
  a second P-channel MOS transistor having a drain connected to the first node, a gate connected to the third node, and a source connected to the second node; and
  a second capacitive element having a first electrode connected to the second node, and a second electrode disposed to receive the second pulse signal, wherein the first pulse signal is set at substantially the same level as the external power supply voltage, and the second pulse signal is set at substantially the same level as the boosted voltage outputted from the boosting circuit.

3. The semiconductor memory device according to claim 2, wherein the second pulse signal is set at substantially the same level as a source potential of the memory cell during data erasing.

4. The semiconductor memory device according to claim 2, wherein the negative voltage generating circuit further comprises:
  a third P-channel MOS transistor having a drain connected to the third node, a gate connected to a fourth node, and a source connected to a fifth node;
  a third capacitive element having a first electrode connected to the third node, and a second electrode disposed to receive a third pulse signal which differs from the first pulse signal applied to the first capacitive element;
  a fourth P-channel MOS transistor having a drain connected to the third node, a gate connected to the fifth node, and a source connected to the fourth node; and
  a fourth capacitive element having a first electrode connected to the fourth node, and a second electrode disposed to receive a fourth pulse signal which differs from the second pulse signal applied to the second capacitive element.

5. The semiconductor memory device according to claim 4, wherein the third pulse signal applied to the third capacitive element has substantially the same level as the first pulse signal applied to the first capacitive element, and the fourth pulse signal applied to the fourth capacitive element has substantially the same level as the second pulse signal applied to the second capacitive element.

6. A semiconductor memory device comprising:
  a memory cell formed on a semiconductor substrate, the memory cell including a charge accumulated portion and a control gate provided above the charge accumulated portion, wherein data programming and erasing in the memory cell is performed by transferring electric charge in the charge accumulated portion;

a boosting circuit for boosting an external power supply voltage;

a pulse generating circuit for generating first and second pulse signals with first and second amplitudes, respectively, the second amplitude being greater than the first amplitude, the pulse generating circuit including a voltage converting circuit which is supplied with a boosted voltage outputted from the boosting circuit, the voltage converting circuit generating the second pulse signal; and a positive voltage generating circuit for generating a control voltage to be applied to at least the control gate of the memory cell, wherein the positive voltage generating circuit comprises:
  a first N-channel MOS transistor having a drain connected to a first node, a gate connected to a second node, and a source connected to a third node;
  a first capacitive element having a first electrode connected to the first node, and a second electrode disposed to receive the first pulse signal;
  a second N-channel MOS transistor having a drain connected to the first node, a gate connected to the third node, and a source connected to the second node; and
  a second capacitive element having a first electrode connected to the second node, and a second electrode disposed to receive the second pulse signal, wherein the first pulse signal is set at substantially the same level as the external power supply voltage, and the second pulse signal is set at substantially the same level as a boosted voltage outputted from the boosting circuit.

7. A voltage generating circuit comprising:
  a first MOS transistor having a drain connected to a first node, a gate connected to a second node, and a source connected to a third node;
  a first capacitive element having a first electrode connected to the first node, and a second electrode disposed to receive a first pulse signal with a first amplitude;
  a second MOS transistor having the same conductivity as the first MOS transistor, and having a drain connected to the first node, a gate directly connected to the third node, and a source directly connected to the second node;
  a second capacitive element having a first electrode connected to the second node, and a second electrode disposed to receive a second pulse signal with a second amplitude greater than the first amplitude; and
  a boosting circuit for boosting an external power supply voltage, and wherein the first pulse signal is set at substantially the same level as the external power supply voltage, and the second pulse signal is set at substantially the same level as a boosted voltage outputted from the boosting circuit.

8. A semiconductor memory device comprising:
  a memory cell formed on a semiconductor substrate, the memory cell including a charge accumulated portion and a control gate provided above the charge accumulated portion, wherein data programming and erasing in the memory cell is performed by transferring electric charge in the charge accumulated portion;
  a boosting circuit for boosting an external power supply voltage;
  a pulse generating circuit for generating first and third pulse signals with a first amplitude and second and fourth pulse signals with a second amplitude, the second amplitude being greater than the first amplitude, the pulse generating circuit including a voltage converting circuit which is supplied with a boosted voltage outputted from the boosting circuit, the voltage converting circuit generating the second and fourth pulse signals; and a voltage generating circuit for generating a control voltage to be applied to the memory cell, wherein the voltage generating circuit comprises:

a first MOS transistor having a first end of a current path connected to a first node, a gate connected to a second node, and a second end of the current path connected to a third node;

a first capacitive element having a first electrode connected to the first node, and a second electrode disposed to receive the first pulse signal;

a second MOS transistor having a first end of a current path connected to the first node, a gate connected to the third node, and a second end of the current path connected to the second node;

a second capacitive element having a first electrode connected to the second node, and a second electrode disposed to receive the second pulse signal;

a third MOS transistor having a first end of a current path connected to the third node, a gate connected to a fourth node, and a second end of the current path connected to a fifth node;

a third capacitive element having a first electrode connected to the third node, and a second electrode disposed to receive the third pulse signal;

a fourth MOS transistor having a first end of a current path connected to the third node, a gate connected to the fifth node, and a second end of the current path connected to the fourth node; and a fourth capacitive element having a first electrode connected to the fourth node, and a second electrode disposed to receive the fourth pulse signal, wherein the first, second, third and fourth pulse signals are different in phase from each other, and the first and third pulse signals are set at substantially the same level as the external power supply voltage, and the second and fourth pulse signals are set at substantially the same level as the boosted voltage outputted from the boosting circuit.

9. The semiconductor memory device according to claim 8, wherein the first, second, third and fourth pulse signals have timings where their edges occur in the order of the first, third, second, second, third, first, first, third, fourth, fourth, third, first pulse signals in one cycle.

* * * * *